United States Patent [19]
Ishihara et al.

[11] Patent Number: 5,213,997
[45] Date of Patent: May 25, 1993

[54] METHOD FOR FORMING CRYSTALLINE FILM EMPLOYING LOCALIZED HEATING OF THE SUBSTRATE

[75] Inventors: Shunichi Ishihara, Hikone; Jun-ichi Hanna, Yokohama, both of Japan

[73] Assignee: Canon Kabushiki Kaisha, Tokyo, Japan

[21] Appl. No.: 501,484

[22] Filed: Mar. 30, 1990

[30] Foreign Application Priority Data

Mar. 31, 1989 [JP] Japan .................................. 1-81106

[51] Int. Cl.⁵ .................... H01L 21/26; H01L 21/268; H01L 21/205
[52] U.S. Cl. ..................... 437/173; 437/935; 437/963; 437/967; 437/233; 427/554
[58] Field of Search .................. 148/DIG. 1, 4, 41, 48, 148/90, 93, 122, 152, 150, 169, 33, 33.2, 33.3; 156/610-614; 427/53.1, 54.1, 248.1, 255.1, 56.1, 43.1; 437/81, 62, 83, 84, 101, 105, 106, 108, 112, 173, 174, 247, 935, 963, 967, 973, 233; 136/258

[56] References Cited

U.S. PATENT DOCUMENTS

| | | | |
|---|---|---|---|
| 4,657,777 | 4/1987 | Hirooka et al. | 427/39 |
| 4,683,144 | 7/1987 | Nishimura et al. | 437/173 |
| 4,728,528 | 3/1988 | Ishihara et al. | 427/39 |
| 4,751,192 | 6/1988 | Hirooka et al. | 437/4 |
| 4,759,947 | 7/1988 | Ishihara et al. | 427/38 |
| 4,784,874 | 11/1988 | Ishihara et al. | 427/49 |
| 4,800,173 | 1/1989 | Kanai et al. | 437/173 |
| 4,801,468 | 1/1989 | Ishihara et al. | 427/35 |
| 4,803,093 | 2/1989 | Ishihara et al. | 427/35 |
| 4,806,386 | 2/1989 | Ishihara | 427/39 |
| 4,812,325 | 3/1989 | Ishihara et al. | 427/69 |
| 4,818,563 | 4/1989 | Ishihara et al. | 427/55 |
| 4,818,564 | 4/1989 | Ishihara et al. | 427/69 |
| 4,824,697 | 4/1989 | Ishihara et al. | 427/55 |
| 4,843,030 | 6/1989 | Eden et al. | 437/88 |
| 4,849,249 | 7/1989 | Ishihara et al. | 427/38 |
| 4,885,258 | 12/1989 | Ishihara et al. | 437/40 |
| 4,918,028 | 4/1990 | Shirai | 437/81 |
| 4,942,058 | 7/1990 | Sano | 427/43.1 |

FOREIGN PATENT DOCUMENTS

| | | |
|---|---|---|
| 0241204 | 10/1987 | European Pat. Off. . |
| 0241316 | 10/1987 | European Pat. Off. . |
| 0368651 | 5/1990 | European Pat. Off. . |
| 0394462 | 10/1990 | European Pat. Off. . |
| 0219728 | 11/1985 | Japan .................................. 437/173 |
| 0219729 | 11/1985 | Japan .................................. 437/173 |
| 62-96675 | 5/1987 | Japan . |
| 62-240766 | 10/1987 | Japan . |
| 62-240767 | 10/1987 | Japan . |
| 62-241326 | 10/1987 | Japan . |
| 62-243767 | 10/1987 | Japan . |
| 1-172576 | 7/1989 | Japan . |
| WO9001794 | 2/1990 | PCT Int'l Appl. . |

OTHER PUBLICATIONS

W. E. Spear et al., Electronic Properties of Microcrystalline Silicon Films Prepared in a Glow Discharge Plasma, J. De Physique, vol. 42, (Oct. 1981).

T. Noguchi et al., Advanced Superthin Polysilicon Film Obtained by Si⁺ Implantation and Subsequent Annealing, J. Electrochem. Soc., (vol. 134—Jul. 1987).

G. W. Cullen (Editor); Single-Crystal Silicon on Non-Single-Crystal Insulators; Journal of Crystal Growth, (vol. 63, No. 3), Oct. 11, 1983.

T. I. Kamins et al., Structure of Chemically Deposited Polycrystalline-Silicon Films, Thin Solid Films, 16, (1973), pp. 147-165.

*Primary Examiner*—George Fourson
*Attorney, Agent, or Firm*—Fitzpatrick, Cella, Harper & Scinto

[57] ABSTRACT

A method for forming a crystalline film comprises respectively introducing into a film forming space having a substrate arranged therein a gaseous starting material for formation of the crystalline film and a gaseous halogenic oxidizing agent capable of chemically reacting with the starting material to form the film, the substrate having a surface comprised of a non-single crystal material having a predetermined temperature distribution.

4 Claims, 7 Drawing Sheets

EVACUATION APPARATUS

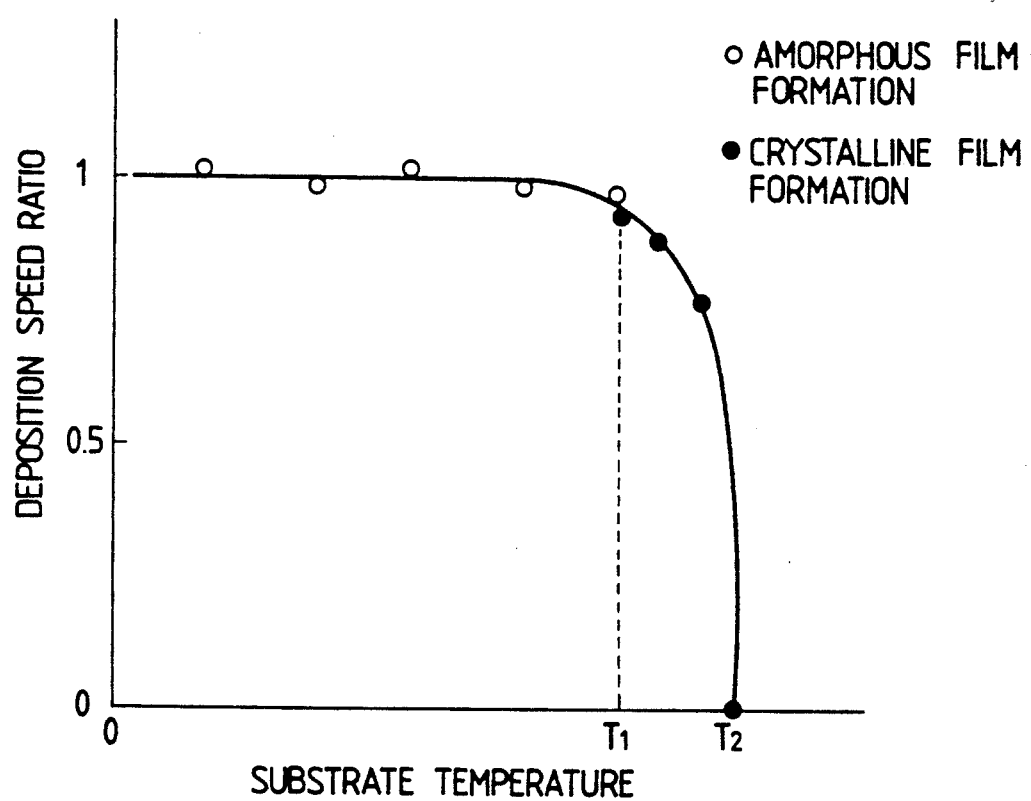

METHOD FOR FORMING CRYSTALLINE FILM EMPLOYING LOCALIZED HEATING OF THE SUBSTRATE

BACKGROUND OF THE INVENTION

1. Field of the Invention

This invention relates to a method for forming crystalline thin film having good crystallinity to be used for semiconductor devices such as image inputting device, image displaying device, photoelectric converting device, photographing device, etc.

2. Related Background Art

In recent years, it has been the practice to form a semiconductor device by depositing a crystalline semiconductor thin film on an amorphous substrate with a large area such as so called glass, and forming a desired pattern thereon which has been also provided for practical use. For example, a polycrystalline silicon film has been used as the driving device for liquid crystal display, etc., and for formation thereof, primarily the normal pressure CVD method, the low pressure CVD (LPCVD) method, the plasma CVD method, etc. have been employed, generally the LPCVD method has been employed widely and industrialized.

It is effective to reduce the amount of the grain boundaries existing in the semiconductor layer of the semiconductor device, namely essentially required to increase the grain sizes in the polycrystalline film.

However, in the LPCVD method as mentioned above, when an amorphous substrate is used, the grain size can be increased only to about the height of 0.1 $\mu$m–0.3 $\mu$m even if the substrate temperature may be made about 1000° C. (T. I. Kammins & T. R. Cass, Thin solid Film, 16 (1973) 147).

In contrast, enlargement of grain size in polycrystalline silicon film has been attempted variously in recent years. For example, there have been investigated the method in which, after deposition of a thin film by an energy beam such as laser, electron beam, lamp, band-shaped heater, etc., the thin film is subjected to heat treatment in the solid phase as such or melting recrystallization (Single crystal silicon on non-single-crystal Insulators. Journal of crystal growth, vol. 63, No. 3, October, 1983, elected by G. W. Cullen) and the method in which after deposition of a thin film, the thin film is once made amorphous by ion implantation and then subjected to solid phase growth (T. Nagai, H. Hayasi, T. Ohshima, Journal of Electro-chemical Society, 134 (1987) 1771) . According to these methods, a polycrystalline silicon thin film having larger grain sizes as compared with the LPCVD method as described above has been obtained, and particularly in the latter method, one having a grain size of about 5 $\mu$m is obtained. Further, among electric field effect transistors prepared by the polycrystalline silicon thin films formed by these methods, one having an electron mobility to the same extent as in the case when prepared by use of a single crystalline silicon has been also reported.

However, many problems are involved in complicatedness, controllability, speciality, ease of the steps in the grain size enlargement techniques as described above. Also, since the process temperature becomes high, there is also the problem that no inexpensive glass substrate can be employed, and therefore they are unsuitable for forming easily a polycrystalline silicon thin film with large grain size and little grain boundary at a large area.

On the other hand, according to the plasma CVD method, it is possible to lower the substrate temperature (<400° C.) and also enlargement of area can be easily done, but the silicon film formed has a grain size of 0.05 $\mu$m or less, and also has a structure containing amorphous phase in the film, even when formed into amorphous or polycrystalline film, whereby the carrier mobility of electrons becomes 1 cm$^2$/v sec to accomplish no desired high performance semiconductor device (W. E. Spear, G. Willeke, P. G. LeComber, A. G. Fitzgerald, Journal de Physique, C4 (1981) 257).

For solving such problems of the plasma CVD method, the method of forming a polycrystalline silicon film by use of the HR-CVD method (Hydrogen Radical Assisted CVD Method) disclosed in Japanese Patent Laid-open Application No. 62-241326 has been proposed, but the crystal grain size in the film immediately after formation of deposition film is about 0.2 $\mu$m, which is slightly improved as compared with the plasma CVD method, and it is necessary to impart heat or light energy during or after formation of the film in order to enlarge further the grain size (Japanese Patent Laid-open Application Nos. 62-240766, 62-240767, 62-243767).

In the films as described above, the grain size enlargement technique of polycrystalline silicon film of the prior art depends greatly on many steps and high temperature process, and for supplying semiconductor devices demanded to have high performances such as image display device, photoelectric converting device, etc. widely to the market, it has been desired to have a method for forming a polycrystalline silicon film with good crystallinity and large grain size, namely with little defect, on a large area non-single-crystal substrate at low temperature easily and stably.

SUMMARY OF THE INVENTION

An object of the present invention is to remove the drawbacks of the prior art as described above and at the same time provide a novel method for forming a polycrystalline semiconductor thin film different from the formation method of the prior art.

Another object of the present invention is to provide a method for forming a crystalline thin film which can form a large grain size polycrystalline semiconductor thin film with a grain size of 1 $\mu$m or larger easily on a non-single crystal substrate after deposition of a thin film without requiring any treatment at all.

Still another object of the present invention is to provide a method for forming a crystalline thin film which is suitable for enlargement of the area of film, and can accomplish improvement of productivity and reduction of most of the film easily, while effecting improvement of the characteristics and reproducibility of the polycrystalline semiconductor film formed and uniformization of the film quality.

Still further object of the present invention is to provide a method for forming a crystalline film comprising respectively introducing into a film forming space having a substrate arranged therein a gaseous starting material for formation of the crystalline film and a gaseous halogenic oxidizing agent capable of chemically reacting with said starting material to form the film, said substrate having a surface comprised of an non-single crystal material having a predetermined temperature distribution.

BRIEF DESCRIPTION OF THE DRAWINGS

FIG. 4 is a diagram showing an example of the relationship between the substrate temperature and the deposition speed ratio.

DETAILED DESCRIPTION OF EMBODIMENTS

Figure 1:
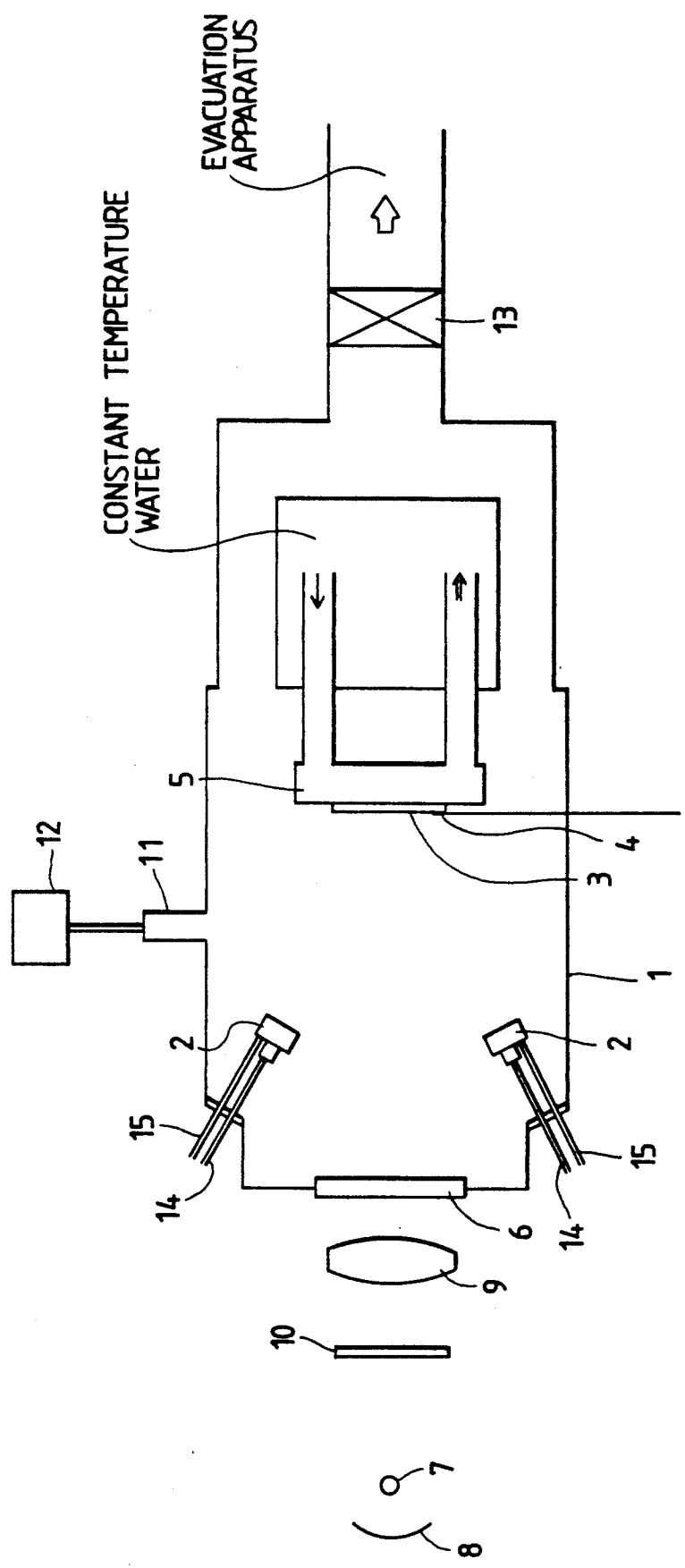
FIG. 1 is an example of the film forming apparatus suitable for practicing the present invention.

The present inventors have intensively studied in order to solve the various problems of the prior art as described above and consequently found that the formation conditions of growth nucleus can be controlled at the initial stage of thin film formation at low temperature, and further made studies on the basis of such finding to accomplish the present invention.

The method of the present invention is to introduce a gaseous starting material for preparation of a crystalline film and a gaseous halogenic oxidizing agent which undergoes chemical reaction with said gaseous starting material into a film forming space in which a non-single crystal substrate having a temperature distribution maintained at a relatively low temperature respectively through introducing pipes into the film forming space, whereby forming crystal growth nuclei, controlling their formation positions and densities and permitting said crystal growth nuclei to grow to obtain a polycrystalline thin film with large grain size.

The method of forming an amorphous or crystalline deposition film on a substrate existing in a film forming space by causing the chemical reaction to occur by introducing a gaseous starting material for formation of a deposition film and a gaseous halogenic oxidizing agent having the property of oxidative action on said starting material, thereby forming e plurality of precursors including the precursor for formation of the deposition film has been disclosed previously by the present Applicant in Japanese Patent Laid-open Application No. 62-96675.

In the method disclosed in the above published specification, since no control of formation density of the crystal growth nucleus on the non-single crystal substrate was done in deposition of a crystal film, it was difficult to obtain a crystalline film of large grain size at regular arrangement.

The present inventors have attempted the methods for obtaining crystalline films of large grain size according to the above-mentioned method for formation of deposition film by repeating experiments.

As a result, it has been found that, by making a temperature distribution on the surface of the substrate, even on a non-single crystal substrate, formation of crystal growth nucleus is possible by controlling the formation position and/or formation density.

Further, according to the above-mentioned deposition film formation method, it is also possible to form the fine crystal region which becomes the above crystal growth nucleus and the non-amorphous region simultaneously on the same non-single crystal substrate by one deposition, and also to form only the fine crystal region which becomes the above crystal growth nucleus scatteredly and with position control on the non-single crystal substrate.

According to the method of the present invention, since the fine crystal nucleus which becomes the crystal growth nucleus is once formed, a crystal thin film of large grain size can be obtained even at a low temperature of 600° C. or lower with its fine crystal as the nucleus. For example, when the fine crystal region which becomes the above growth nucleus and the amorphous region are simultaneously formed on the non-single crystal substrate by one deposition, by applying heat annealing on the sample, crystal grains of the above-mentioned fine crystals can be increased through the phase transfer from the amorphous phase to the crystalline phase, thereby consequently forming the crystal grains having grain sizes capable of forming device preparation with position control. On the other hand, when only fine crystal regions which become crystal growth nuclei are formed scatteredly and with position control on the non-single crystal substrate, by performing selective growth with the above-mentioned fine crystal regions as growth nuclei by subsequent gas phase growth, crystal grains having grain sizes with sizes capable of device preparation can be formed with position control.

In the following, the experiments conducted by the present inventors are described in detail.

In the deposition film formation method of the present invention the gaseous starting material for formation of deposition film (hereinafter called "gaseous starting material (I)") receives oxidation by contact with a gaseous halogenic oxidizing agent (hereinafter called "halogenic oxidizing agent (II) "), and may be suitably selected as desired depending on the kind, the characteristics, the use of the desired deposition film.

In the method of the present invention, the gaseous starting material (I) and the halogenic oxidizing agent (II) as mentioned above may be gaseous when introduced, and may be either gaseous, liquid or solid in normal state. When the gaseous starting material (I) or the halogenic oxidizing agent (II) is liquid or solid under normal state, the gaseous starting material (I) or the halogenic oxidizing agent (II) may be introduced in gaseous state into the film forming space while effecting bubbling by use of a carrier gas such as Ar, He, $N_2$, $H_2$, etc., with heating, if necessary, thereby forming an adsorbed layer on the substrate, and subsequently introducing the other in gaseous state.

In this case, the introduction pressure of the above-mentioned gaseous starting material (I) or halogenic oxidizing agent (II) is set by controlling the vapor pressure of the flow rate of the carrier gas or the vapor pressure of the gaseous starting material (I) or the halogenic oxidizing agent (II). When the gaseous starting material (I) or the halogenic oxidizing agent (II) is gaseous under normal state, it can be also introduced with dilution with a carrier gas such as Ar, He, $N_2$, $H_2$, if necessary.

As the gaseous starting material (I) to be used in the method of the present invention, for obtaining a deposition film of silicon belonging to the group IV of the periodic Table, straight end branched chain silane compounds, cyclic silane compounds can be included as effective ones.

Specifically, there may be included $Si_nH_{2n+2}$ (n=1, 2, 3, 4, 5, 6, 7, 8) as straight chain silane compounds, $Si_nH_3SiH(SiH_3)$ $SiH_3SiH_3$ as branched chain silane compounds, and $Si_nH_{2n}$ (n=3, 4, 5, 6) as cyclic silane compounds.

Of course, these silicon type compounds can be used not only as a single kind but as a mixture of two or more kinds.

The halogenic oxidizing agent (II) to be used in the method of the present invention has the property of effective oxidizing action only by being made gaseous during introduction into a film forming space and at the same time brought into contact with the gaseous starting material for formation of deposition film, and may include halogenic gases such as $F_2$, $Cl_2$, $Br_2$, $I_2$, ClF as effective ones.

These halogenic oxidizing agents are gaseous, and introduced into the reaction space together with the gas of the starting material for formation of deposition film as described above with desired flow rate and supplying pressure given to be mixed with and collided against the starting material, thereby effecting chemical contact to cause oxidation action on the starting material and form efficiently plural kinds of precursors including the precursor under excited state. At least one of the precursor under excited state and other precursors formed act as the supplying source of the constituent of the deposition film formed.

The precursor formed is decomposed or reacts to become another precursor under excited state or a precursor under another excited state, or contact in the form as such with the substrate surface arranged in the film forming space although releasing energy if necessary, whereby a deposition film with a three-dimensional network structure is prepared.

As the energy level excited, the precursor under the above-mentioned excited state undergoes energy transition to lower energy level. Alternatively, it should be preferably at an energy level which accompanies emission in the process of being changed to another chemical substance. Including such precursors accompanied with emission for transition of energy, by formation of the activated precursors, the deposition film formation process of the present invention can proceed with better efficiency and more energy saving, whereby a deposition film uniform over the whole film surface and having better physical characteristics can be formed.

In the present invention, so that the deposition film formation process may proceed smoothly to form a film of high quality having desired physical characteristics, the kinds and the combination of the starting material and the halogenic oxidizing agent, the mixing ratios of these, the pressure during mixing, the flow rate, the pressure within the film forming space, the flow rates of gases, the film forming temperatures (substrate temperature and atmosphere temperature) as the film forming factors are suitably selected. These film forming factors are organically related with each other, and should not be determined individually, but determined respectively under mutual relationship. In the present invention, the quantitative ratio of the gaseous starting material for formation of deposition film and the gaseous halogenic oxidizing agent to be introduced into the reaction space is determined suitably as desired in the relationship with the film forming factors concerned in the above-mentioned film forming factors, but it should be suitably 1/100 to 100/1, more preferably 1/50 to 50/i in terms of the ratio introduced.

As the pressure during mixing when introduced into the reaction space, it should be preferably higher for enhancing chemical contact between the gaseous starting material and the gaseous halogenic oxidizing agent as mentioned above in probability, but it is better to determine suitably as desired in view of the reactivity. As the pressure during mixing as mentioned above, which is determined as described above, it should be preferably made $1 \times 10^{-7}$ atm to $1 \times 10$ atm, more preferably $1 \times 10^{-6}$ atm to 3 atm.

The pressure within the reaction space, namely the pressure within the space on the surface of which is arranged the gas to be formed into film, is set suitably as desired so that the precursor (E) under the excited state formed within the reaction space and, in some cases, the precursor (D) derived from said precursor (E) may contribute effectively to film formation.

The inner pressure within the film forming space, when the film forming space is openly continuous to the reaction space, can be controlled by adding contrivances such as differential evacuation or use of a large scale evacuation apparatus to the gaseous starting material and the gaseous halogenic oxidizing agent in the relationship with the introduction pressures and the flow rates.

Alternatively, when the conductance at the connecting portion between the reaction space and the film forming space is small, the pressure in the film forming space can be controlled by providing an appropriate evacuation apparatus in the film forming space and controlling the evacuation amount of said apparatus.

Also, when the reaction space and the film forming space are made integral, and the reaction space and the film forming space only differ spatially, differential evacuation may be effected, or a large scale evacuation apparatus having sufficient evacuation capacity may be provided as described above.

As described above, the pressure within the film forming space is determined in the relationship with the introduction pressures of the gaseous starting material and the gaseous halogenic oxidizing agent, but may be preferably 0.001 Torr to 100 Torr, more preferably 0.01 Torr to 30 Torr, optimally 0.05 Torr to 10 Torr.

The non-single crystal material constituting the substrate surface includes, for example, an amorphous material such as $SiO_2$, SiN, $Al_2O_2$, etc. and a polycrystalline material.

As to the flow regions of gases, it is required that they should be designed in view of the geometrical arrangement of the gas introducing inlets and the gas evacuation outlets of the substrates so that during introduction of the above-mentioned starting material and halogenic oxidizing agent into the reaction space, these may be uniformly and efficiently mixed to form the above-mentioned precursor (E) efficiently, and also film formation may be effected adequately without trouble.

In the case of the present invention, the distance between the substrate and the gas discharging outlet of the gas introducing pipe may be determined to become adequate state in view of the kind of the deposition film to be formed and its desired characteristics, the gas flow rate, the vacuum chamber, the inner pressure, etc., but may be preferably several mm to 20 cm, more preferably 5 mm to 15 cm, for supplying the above-mentioned precursor efficiently to the substrate.

[Experiments]

Figure 2A:
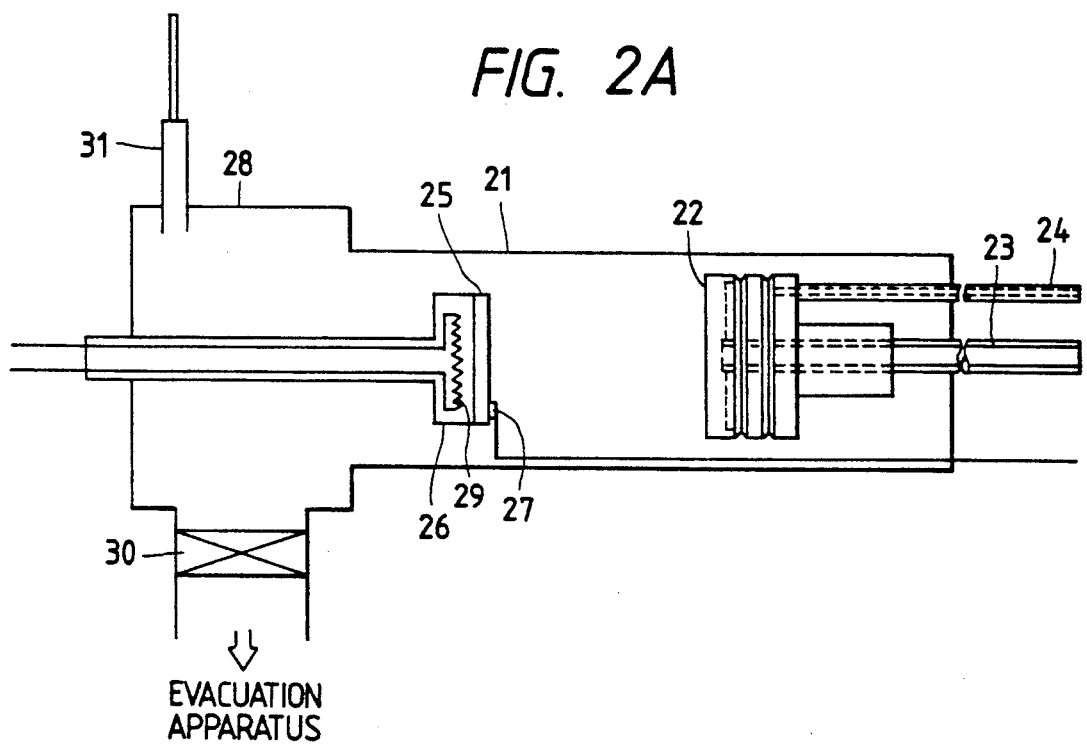
FIG. 2A is an illustration of an example of the film forming apparatus of the method for forming a deposition film by formation of a precursor by the chemical reaction between a gaseous starting material gas and a gaseous halogenic oxidizing agent.

In the deposition film formation method as described above, for examination of the influence of the substrate temperature concerning film formation, film formation was performed by use of the apparatus shown in FIG. 2 by varying the substrate temperature. In the apparatus in FIG. 2A, the star zing gas for film formation and the halogenic oxidizing agent are introduced respectively through the gas introducing pipes 23 and 24 into the reaction tube 1 made of quartz which functions as both reaction space and film forming space through the blowing nozzle 22.

Figure 2B:
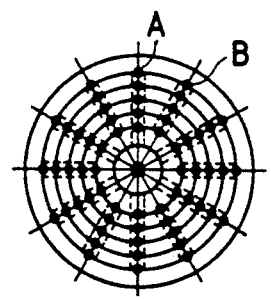
FIG. 2B is an illustration showing the shape of the blowing surface of a gas blowing nozzle.

FIG. 2B shows the shape of the blowing nozzle 2 at the blowing surface, and the starting gas for film formation and the halogenic oxidizing agent are blown out respectively through the blowing holes A and B which are arranged alternately in radial shapes. As the result, uniform mixing of gases occurs, and the chemical reaction occurs uniformly in gas phase to form uniform precursors, with the result that a uniform film is formed o the substrate 25.

The substrate 25 is placed on a substrate holder 26 located at the position opposed to the blowing nozzle 22.

The substrate temperature is controlled by a heater 29 embedded within the substrate holder 26.

The distance between the substrate 25 and the nozzle 22 can be changed by moving the respective located places.

In the Figure, 28 is a chamber for fixing the reaction tube 21 and the substrate holder 26, which is connected to the evacuation chamber through an evacuation valve 30. 31 is a gauge for measuring the pressures in the reaction space and the film forming space, and is mounted on the vacuum chamber 28.

By making 70 mm the distance between the substrate holder 26 and the gas blowing pipe 22, $SiH_4$ gas was introduced through the gas introducing pipe 23 respectively at flow rates of 15 sccm, 20 sccm and 30 sccm.

The pressure within the chamber was maintained at 0.2 Torr by controlling the evacuation amount of the evacuation apparatus. Through the gas introducing pipe 4, $F_2$ gas diluted with He gas to 10% was introduced at 300 sccm.

The substrate temperature was varied from room temperature (25° C.) to 500° C. to effect deposition for 30 minutes. From the thickness of the film obtained, the deposition speed was determined. Also, evaluation of the film was performed from electron beam analysis about whether it was amorphous film or crystalline film.

Figure 3:
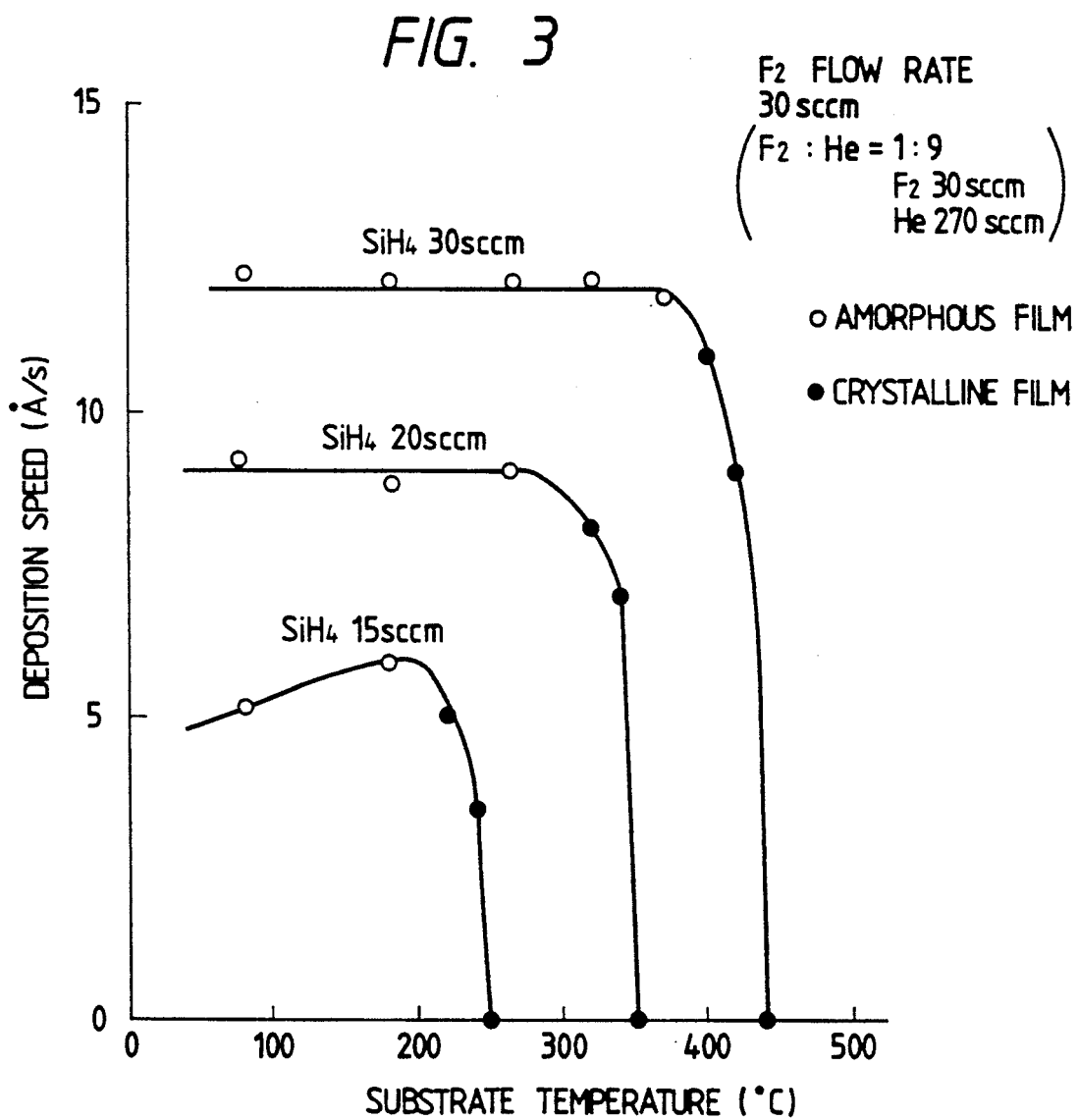
FIG. 3 is a diagram showing the dependency of deposition speed and film quality on the substrate temperature.
Figure 5A:
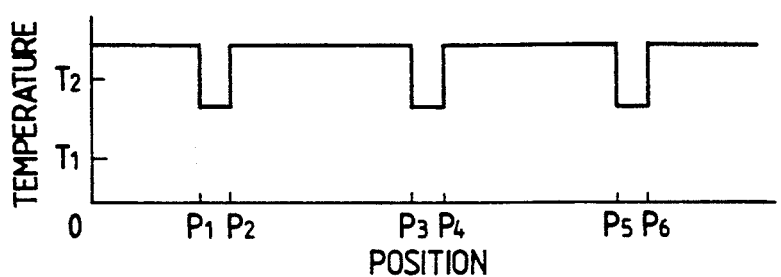
FIGS. 5A–5D are diagrams showing an example of the temperature distribution pattern when crystalline films are formed only at the regions of the desired positions $P_1P_2$, $P_3P_4$ and $P_5P_6$, without causing formation of deposition film to occur in other regions.
Figure 5B:
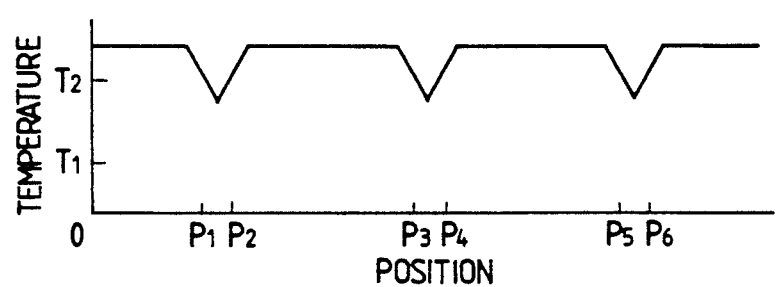
Figure 5C:
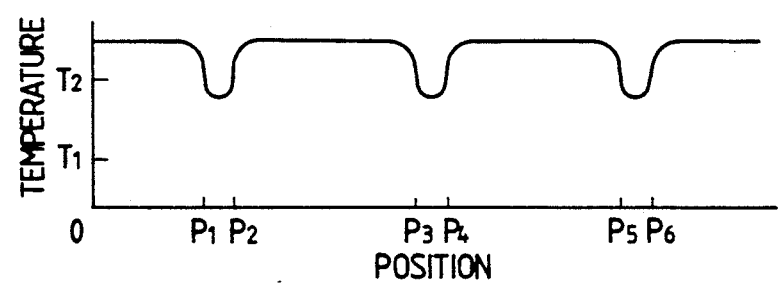
Figure 5D:
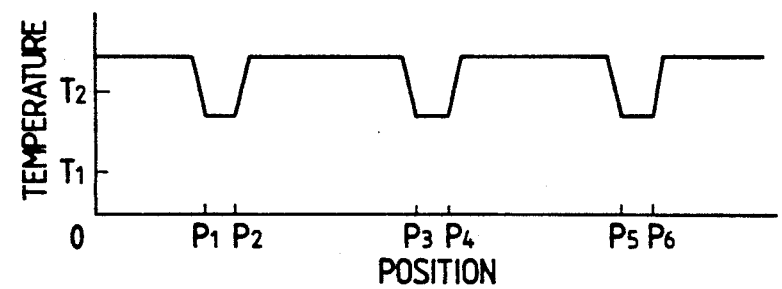

The deposition speed, as shown in FIG. 3, under the conditions of constant $SiH_4$ flow rate, does not depend on the substrate temperature at a certain temperature or lower, but is substantially constant. This shows that the precursors contributing to deposition are formed by the reaction within the gas phase and not varied depending on the substrate temperature. Whereas, if the temperature is elevated, after slight reduction in deposition speed the deposition speed will become abruptly zero, whereby no longer deposition film will be formed. If the substrate temperature may be increased higher, no film will be deposited.

The phenomenon of the deposition speed becoming zero occurs at lower temperature with reduction in the flow rate ratio of $SiH_4$ flow rate: $F_2$ flow rate. When the film qualities of the respective deposited films were evaluated by electron beam diffraction, in FIG. 3 the film quality with O mark was found to be amorphous film only of halo pattern, while the film quality with • mark to be a crystalline film in which ring pattern could be seen. Also, in the crystalline film, X-ray diffraction measurement was performed and the crystal grain size was measured from the half-value width of the diffraction pattern. As the result, in the film formed under the condition of $SiH_4$ 30 sccm, it was found to be 300 Å when the substrate temperature was 400° C. and 600 Å when the substrate temperature was 420° C. Also under other $SiH_4$ flow rate conditions, it was found to be 300 Å to 600 Å, thus indicating the tendency that the grain size becomes larger in samples as the substrate temperature is higher within the temperature range capable of giving crystalline film, in the films deposited under the same $SiH_4$ flow rate condition.

As the result of the experiments as described above, it has been found that phenomena of deposition of amorphous film, deposition of crystalline film and no film deposition can be seen by controlling the substrate temperature under the flow rate conditions of the same $SiH_4$ flow rate: $F_2$ flow rate.

As is apparent from FIG. 3, the substrate temperature at which crystalline film can be obtained is the temperature or higher at which deposition speed begins to be abruptly reduced, and has a certain temperature range. In the present embodiment, its range is about 50° C. to 70° C.

Therefore, for separating the regions where amorphous film and crystalline film are deposited and separating the region where crystalline film is deposited from the region where no film is deposited, the substrate temperature may be made to have a distribution as described below.

That is, in the case of separating the regions where amorphous film and crystalline film are deposited, a temperature distribution may be provided so as to sandwich the substrate temperature at which the deposition speed begins to be abruptly reduced. In the present embodiment, it is desirable that the temperature distribution range should be made within from 50° C. to 70° C.

On the other hand, in the case of separating the region where crystalline film is deposited from the region where no film is deposited, the temperature distribution of the above-mentioned range may be provided which is higher than the substrate temperature at which the deposition speed begins to be abruptly reduced. In the present embodiment, it is preferable that the temperature distribution range should be made within from 50° C. to 70° C.

Further, in the case of separating the region where amorphous film and crystalline film are deposited from the region where no film is deposited, the region of the substrate temperature lower than the substrate temperature at which the deposition speed begins to be abruptly reduced and the region where amorphous film is deposited may be made coincident, the region of the substrate temperature at which the deposition speed begins to be abruptly reduced or higher and less than the substrate temperature at which the deposition speed becomes O coincident, and the region of the substrate temperature where the deposition speed becomes O or higher and the region where no film is deposited coincident.

Next, an example of the substrate surface temperature distribution for forming a crystalline film at a desired position on the substrate is described. The above temperature distribution in the present invention is not limited only to the example shown below.

First, FIG. 4 shows an example of the relationship between the substrate temperature and the deposition speed ratio. Here, the deposition speed ratio is shown in relative value to the maximum deposition speed during film formation under constant conditions except for the substrate temperature. In FIG. 4, $T_1$ is the lower limit of the substrate surface temperature at which crystalline film can be obtained under constant conditions except for the substrate temperature, and $T_2$ the upper limit of the substrate temperature at which crystalline film can be obtained under constant conditions except for the substrate temperature.

For formation of a crystalline film at a desired position, as is also apparent from FIG. 4, only the desired position may be made the substrate temperature which is $T_1$ or higher and $T_2$ or lower.

FIGS. 5A–5D show an example of the temperature distribution pattern when crystalline films are formed only at the regions of the desired positions $P_1P_2$, $P_3P_4$ and $P_5P_6$, without causing formation of deposition film to occur in other regions.

In this case, the desired regions may be made the substrate surface temperatures of $T_1$ to $T_2$, other regions the substrate temperature over $T_2$.

Figure 6A:
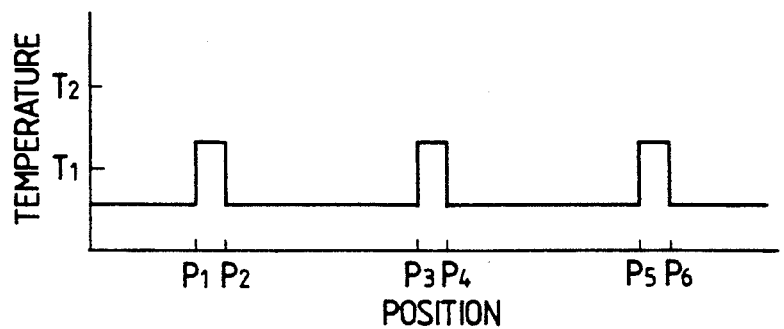
FIGS. 6A–6C are diagrams showing an example of the temperature distribution pattern when crystalline films are formed only at the regions $P_1P_2$, $P_3P_4$ and $P_5P_6$ of the desired positions, and amorphous films in other regions.
Figure 6B:
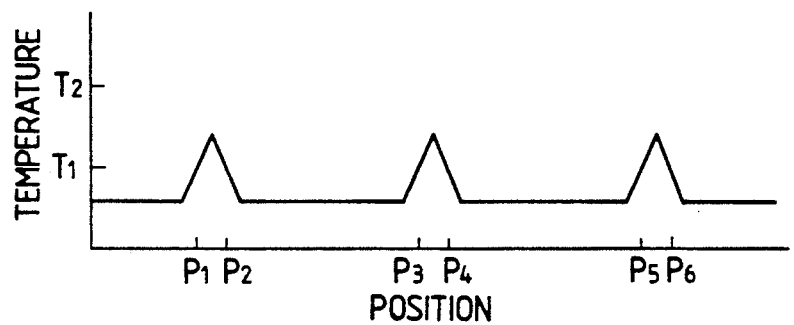
Figure 6C:
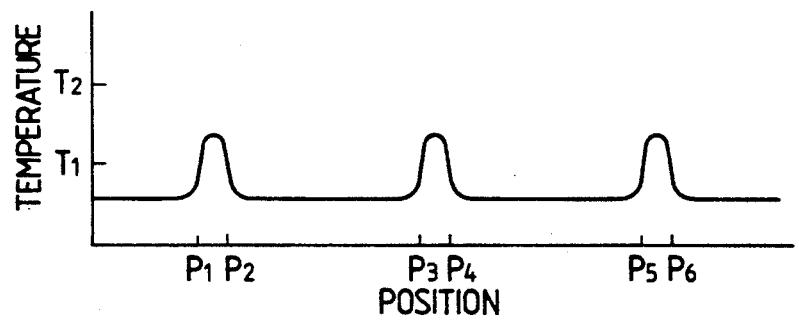

Subsequently, FIGS. 6A–6C show an example of the temperature distribution pattern when crystalline films are formed only at the regions $P_1P_2$, $P_3P_4$ and $P_5P_6$ of the desired positions, and amorphous films in other regions.

In this case, the desired regions may be made the substrate temperature of $T_1$ to $T_2$, and other regions the substrate temperature lower than $T_1$.

Figure 7A:
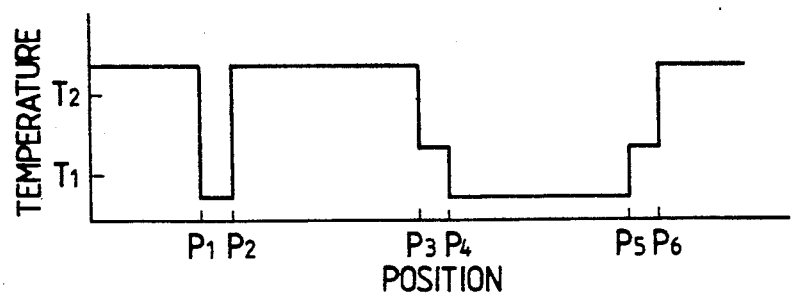
FIGS. 7A–7C are diagrams showing an example of the temperature distribution pattern when the region for forming crystalline film, the region for forming amorphous film and the region where no deposition occurs are formed on the same substrate.
Figure 7B:
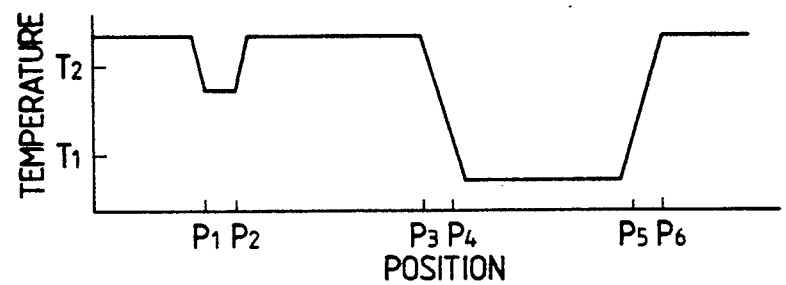
Figure 7C:
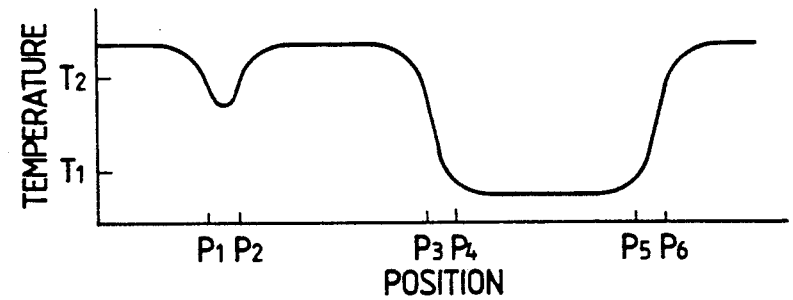

Subsequently, FIGS. 7A–7C show an example of the temperature distribution pattern when the region for forming crystalline film, the region for forming amorphous film and the region where no deposition occurs are formed on the same substrate.

In the case of the temperature distribution shown in FIG. 7A, crystalline films can be formed at the regions $P_3P_4$ and $P_5P_6$ of the desired positions, amorphous film at the regions $P_1P_2$ and $P_4P_5$ and no deposition film in other regions.

In the case of the temperature distribution shown in FIGS. 7B and 7C, crystalline films can be formed at the regions $P_1P_2$, $P_3P_4$ and $P_5P_6$ of the desired positions, amorphous film at the region $P_4P_5$, and no deposition film in other regions.

The range of the size of the region for forming crystalline film should be desirably the maximum length, preferably from 500 Å to 1 mm, more preferably from 1000 Å to 100 μm.

If the size is less than this range, the desired temperature control can be done with difficulty, while if it exceeds this range, crystalline film with large grain size can be obtained with difficulty.

For forming a crystalline film of large grain size on a substrate while suppressing variance in grain size, it is desirable to provide the regions for formation of crystalline films at equal intervals. The distance in that case may be preferably from 1 μm to 10 mm, more preferably from 10 μm to 1 mm.

Also, for the same purpose, the substrate surface temperature distribution may be also made to have the periodical change with the above-mentioned interval as one cycle.

The region for forming crystalline film may be provided as dispersed on the whole substrate surface, or on a part of the substrate.

The present embodiment has described about the conditions in the $SiH_4$-$F_2$-He system, but the values of the substrate temperature range in the embodiment as described above will vary depending on the kind of film to be formed, the starting gases employed, the pressure, the flow rates, etc., and the distribution condition of the substrate temperature in the present invention is not limited only to the examples as described above.

This phenomenon is estimated to be attributable to the fact that the amount of F active species in gas phase or on the deposition film surface is increased with temperature elevation, whereby etching of the deposition film with F active species begins to have influence on deposition.

When the substrate temperature is low, the ratio of F active species is low, and therefore the effect of etching is almost negligible. When the effect of etching appears as the substrate temperature becomes higher, etching begins to be effected in bonds with weaker bonding among the deposited films. Also, precursors are sprayed thereon to form bonds with deposited films. Therefore, bonds with stronger bonding remain, whereby crystalline films become to be deposited. Further, it is estimated that, if the substrate temperature is elevated, the etching effect is further strengthened to strengthen the etching process, whereby etching overcomes deposition of all the films, until there is no more deposition of film.

FIG. 1 is an example of the optimum apparatus for film formation method of the present invention.

The film forming chamber 1 which functions as both the reaction space and the film forming space is internally equipped with two gas blowing nozzles 2 of the same structure as 2 in FIG. 2. The two gas blowing nozzles are arranged so that substrate heating with IR light or laser irradiation as described below may not be obstructed. Similarly as the gas blowing nozzle of 2 in FIG. 2, the starting gas for film formation and the halogenic oxidizing gas are respectively introduced through the two separate gas introducing pipes. At the position opposed to the two gas blowing nozzles 2 is placed a substrate 3 on a substrate holder 5. Within the substrate holder 5 is circulated constant temperature water so as to cool the substrate holder 5. The temperature on the substrate is monitored by a thermocouple 4 provided on the substrate. Heating of the desired region on the substrate surface is performed by, for example, a concave surface reflective mirror 8 and a convex lens 9 by means of IR lamp, laser, electron beam irradiation, etc. located outside of the vacuum chamber 1, thereby effecting uniform IR-ray irradiation on the substrate. As the result, the substrate surface is uniformly heated. The mask filter 10 is a filter for introducing, for example, periodical temperature distribution at the desired position on the substrate surface, which is a filter having UV-ray absorbers having, for example, concentration distributions different periodically in transmittance dispersed on the substrate surface, and strong and weak pattern of IR light occurs until IR light passes through said filter. The strong and weak pattern of IR light is adapted to be focused on the substrate by the convex lens 9. As the result, temperature distribution occurs on the substrate 3. 6 is a window for introduction of IR light. The gases within the chamber are discharged through the evacuation apparatus (Mecab booster pump), and the pressure within the chamber 1 is maintained constant. 13 is an evacuation valve connecting the chamber 1 to the evacuation apparatus. The pressure within the chamber 1 is monitored by the vacuum gauge 11 and the vacuum meter 12, and if necessary, the pressure within the chamber 1 is maintained constant by controlling the opening of the valve 13 and rotational number of the Mecab booster pump.

The method of the present invention is described in detail by forming a desired polycrystalline silicon thin film by use of the apparatus shown in the drawings, but the present invention is not limited by these examples at all.

EXAMPLE 1

By use of the apparatus shown in FIG. 1, a polycrystalline silicon film was deposited, and the film was evaluated. As the substrate, 7059 glass substrate manufactured by Corning was used, and placed on the substrate holder 5. The temperature on the substrate surface was controlled to 450° C. by the combination of the heating with the IR heater 7 and the cooling with constant temperature water. Also, a region with low temperature of spot diameter of 2 $\mu$ were made at intervals of 200 $\mu$ with the mask filter 10. The temperature of this region may be considered to be lower by about 50° C., as estimated from the IR light dose irradiated on this region.

After the vacuum chamber 1 was sufficiently evacuated internally under this state by a turbo molecular pump to $5 \times 10^{-8}$ Torr or lower, $F_2$ gas diluted with He gas to 10% was passed through the gas introducing pipe 15 at 300 sccm. For cleaning of the substrate surface by etching with $F_2$ gas, this state was maintained for 30 minutes. Then, $SiH_4$ gas was passed through the gas introducing pipe 14 at 30 sccm. At this time, the pressure within the vacuum chamber was 0.2 Torr.

After being left to stand under this state for 2 minutes, introduction of all the gases was stopped, irradiation of UV lamp was discontinued, and after the substrate was sufficiently cooled, the sample was taken out of the chamber. When the sample taken out was observed by a transmission electron microscope, no deposition film could be seen in most regions, but small grains of crystals with grain sizes of about 600 Å could be seen at periods of 200 $\mu$ intervals. When diffraction image was taken, most crystals were found to be single crystals oriented in the [111] direction.

EXAMPLE 2

After film formation by flowing 30 sccm of $SiH_4$ with 300 sccm of $F_2/He=10\%$ gas for 2 minutes, the heating conditions on the substrate surface by IR lamp were changed to 400° C., and at the same time, the mask filter 10 was removed from the IR light path so that the substrate surface could be uniformly heated, following otherwise the same procedure as in Example 1.

Deposition was performed by maintaining this state for one hour. Then, gas introduction was stopped, the substrate heating was stopped to effect sufficient cooling, and the sample was taken out of the chamber.

When the polycrystalline Si film formed was observed by a scanning electron microscope, it was found that crystals with crystal sizes of about 2.5 $\mu$ were grown at a period with 200 $\mu$ intervals in the crystal thin film with an average grain size of about 600 Å. The polycrystalline Si film had a film thickness of 3 $\mu$.

When observation by a transmission electron microscope was conducted and the diffraction pattern by X-ray diffraction was measured, it could be confirmed that the crystal with a grain size of about 2.5 $\mu$ was one single crystal.

EXAMPLE 3

By making the temperature on the substrate 350° C., a region of higher temperature of spot diameter of 2 $\mu$ was made with a period of 200 $\mu$m intervals. The temperature of this region may be considered to be higher by about 50° C. by estimation from the IR dose.

Film formation was performed under the same conditions as in Example 1 except for using such temperature condition for two minutes, and as the result of observation by a transmission electron microscope, crystal grains of grain sizes of about 800 Å were seen with 200 $\mu$m intervals in the amorphous film Si. The film thickness of the crystal thin film obtained at this time was about 0.12 $\mu$m.

EXAMPLE 4

When the film deposited under the same conditions as in Example 3 except for changing the film formation time to 2 hours was evaluated similarly, crystal grains of grain size of about 1.2 $\mu$m arranged at 200 $\mu$ intervals in amorphous Si film were seen. This film thickness was 3.6 $\mu$m.

EXAMPLE 5

In Example 4, after film formation, the sample was not immediately taken out, but only introduction of all the gases was stopped and after sufficient evacuation, $H_2$ gas was passed at 300 sccm, and the IR lamp dose was set so that the substrate temperature became 580° C. to effect annealing for 30 hours. The mask filter was removed at this time so that the substrate temperature became uniform.

Then, introduction of $H_2$ gas was stopped, heating by IR lamp was stopped, and after sufficient cooling, the sample was taken out.

Then, as the result of the same evaluation as in Example 4, crystal grains of about 2.5 $\mu$m were seen at a period of 200 $\mu$ intervals in the thin film wherein fine crystal phase with an average grain sizes of about 60 Å and amorphous phase exist in mixture.

EXAMPLE 6

After film formation under the conditions in Example 3 for 5 minutes, introduction of gases was stopped, and the IR lamp dose was set so that the substrate surface temperature became 300° C. The mask filter 10 was removed so that uniform heating could be effected.

Next, only the gas of $F_2$ diluted with He to 10% was passed at 50 sccm for one minute. As the result, most regions of the amorphous film deposited were etched. When this sample was taken out and observed by a transmission electron microscope, only crystal grains of grain sizes of about 600 Å were seen at 200 $\mu$ intervals, and otherwise no adhesion could be seen. The amorphous region could be removed except for leaving the crystals formed at desired portions to remain.

EXAMPLE 7

The sample having the amorphous Si regions etched with leaving crystals formed at desired positions to remain in Example 6 was heated again to 400° C. without taking it outside. At this time, the mask filter 10 was removed so that the substrate could be uniformly heated.

Then, by introducing 30 sccm of $SiH_4$ gas and a gas of $F_2$ diluted with He to 10% into the film forming space, deposition was carried out for one hour. Then, introduction of the gases was stopped, heating of the substrate stopped, and after cooling, the sample was taken out. When the sample was observed by a scanning electron microscope, crystals with grain size of about 2.2 $\mu$ were found to be grown at a period of 200 $\mu$ intervals. This film thickness of the polycrystalline film was 2.8 $\mu$.

What is claimed is:

1. A method for forming a polycrystalline film comprising the steps of:
   (i) separately introducing into a film forming space having a substrate a gaseous starting material for formation of said polycrystalline film and a gaseous halogenic oxidizing agent capable of chemically reacting with said starting material to form said polycrystalline film;
   (ii) controlling temperatures of said substrate so as to vary the temperatures of said substrate and to impart a non-uniform temperature distribution in a range of from 50° C. to 70° C. on said substrate by setting temperatures at specified desired positions in said substrate in accordance with a predetermined temperature distribution pattern, thereby effecting selective deposition of said polycrystalline film in a region having a size of no greater than 1 mm in length at said desired specified positions in accordance with said predetermined temperature distribution pattern; and
   (iii) growing crystal grains on said substrate at said specified desired positions to form said polycrystalline film.

2. The method according to claim 1, wherein the gaseous halogenic oxidizing agent is at least one selected from $F_2$, $Cl_2$, $Br_2$, $I_2$ and ClF.

3. The method according to claim 1, wherein said polycrystalline film is a silicon film.

4. The method according to claim 1, wherein the temperature distribution of the substrate surface is formed by the irradiation of at least one selected from infrared light, laser and electron beam.

* * * * *

UNITED STATES PATENT AND TRADEMARK OFFICE
CERTIFICATE OF CORRECTION

PATENT NO. : 5,213,997
DATED : May 25, 1993
INVENTOR(S) : Shunichi ISHIHARA, ET AL.

It is certified that error appears in the above-indentified patent and that said Letters Patent is hereby corrected as shown below:

COLUMN 1:
    line 18, "thereon" should read --thereon,--;
    line 45, "crystal growth," should read --Crystal Growth,--; and
    line 46, "elected" should read --edited--.

COLUMN 4:
    line 47, "invention" should read --invention,--.

COLUMN 6:
    line 13, "50/i" should read --50/1--.

COLUMN 7:
    line 18, "star zing" should read --starting--; and
    line 32, "o" should read --on--.

COLUMN 8:
    line 3, "speed" should read --speed,--.

COLUMN 9:
    line 31, "PIP$_2$," should read --P$_1$P$_2$,--; and
    line 39, "P1P$_2$," should read --P$_1$P$_2$,--.

UNITED STATES PATENT AND TRADEMARK OFFICE
CERTIFICATE OF CORRECTION

PATENT NO. : 5,213,997
DATED : May 25, 1993
INVENTOR(S) : Shunichi ISHIHARA, ET AL.

It is certified that error appears in the above-indentified patent and that said Letters Patent is hereby corrected as shown below:

COLUMN 10:

line 50, "Similarly" should read --Similarly,--.

Signed and Sealed this

Twenty-ninth Day of March, 1994

Attest:

BRUCE LEHMAN

Attesting Officer     Commissioner of Patents and Trademarks